(12) United States Patent
Onodera et al.

(10) Patent No.: US 12,513,944 B2
(45) Date of Patent: Dec. 30, 2025

(54) SEMICONDUCTOR DEVICE WITH AN OXIDE SEMICONDUCTOR HAVING A PLURALITY OF OPENINGS

(71) Applicant: Magnolia White Corporation, Tokyo (JP)

(72) Inventors: Ryo Onodera, Tokyo (JP); Masashi Tsubuku, Tokyo (JP); Hajime Watakabe, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 519 days.

(21) Appl. No.: 17/894,176

(22) Filed: Aug. 24, 2022

(65) Prior Publication Data

US 2023/0068478 A1 Mar. 2, 2023

(30) Foreign Application Priority Data

Aug. 25, 2021 (JP) ................................. 2021-137250

(51) Int. Cl.
*H10D 30/67* (2025.01)
(52) U.S. Cl.
CPC ..... *H10D 30/6755* (2025.01); *H10D 30/6757* (2025.01)

(58) Field of Classification Search
CPC .......... H10D 30/6755; H10D 30/6757; H10D 30/6721; H10D 30/6713; H10D 86/423; H10D 86/60
See application file for complete search history.

(56) References Cited

U.S. PATENT DOCUMENTS

2018/0356660 A1* 12/2018 Tomida .............. H10D 30/6757

FOREIGN PATENT DOCUMENTS

JP 2017191834 A * 10/2017

* cited by examiner

*Primary Examiner* — William B Partridge
*Assistant Examiner* — Chevy J Boegel
(74) *Attorney, Agent, or Firm* — XSENSUS LLP (57) ABSTRACT

According to one embodiment, a semiconductor device includes a substrate, a first insulating layer disposed on the substrate, an oxide semiconductor disposed on the first insulating layer and formed in an island shape, a second insulating layer covering the oxide semiconductor, a gate electrode disposed on the second insulating layer, and a source electrode and a drain electrode in contact with the oxide semiconductor. The oxide semiconductor includes a plurality of first openings located between the gate electrode and the source electrode, and a plurality of second openings located between the gate electrode and the drain electrode, in planar view.

6 Claims, 9 Drawing Sheets

SEMICONDUCTOR DEVICE WITH AN OXIDE SEMICONDUCTOR HAVING A PLURALITY OF OPENINGS

CROSS-REFERENCE TO RELATED APPLICATIONS

This application is based upon and claims the benefit of priority from Japanese Patent Application No. 2021-137250, filed Aug. 25, 2021, the entire contents of which are incorporated herein by reference.

FIELD

Embodiments described herein relate generally to a semiconductor device.

BACKGROUND

Recently, various semiconductor devices such as display devices comprising transistors using an oxide semiconductor have been proposed. In such transistors using the oxide semiconductor, excessive supply of hydrogen to the oxide semiconductor may cause reduction in reliability such as shift of a threshold voltage. In particular, an influence of diffused hydrogen cannot be ignored in a large transistor having a channel width of more than 10 μm.

A technique of providing a hydrogen suppressing layer to suppress transmission of hydrogen is known as one of methods of reducing the influence of hydrogen.

DETAILED DESCRIPTION

In general, according to one embodiment, a semiconductor device comprises a substrate, a first insulating layer disposed on the substrate, an oxide semiconductor disposed on the first insulating layer and formed in an island shape, a second insulating layer covering the oxide semiconductor, a gate electrode disposed on the second insulating layer, and a source electrode and a drain electrode in contact with the oxide semiconductor. The oxide semiconductor includes a plurality of first openings located between the gate electrode and the source electrode, and a plurality of second openings located between the gate electrode and the drain electrode, in planar view.

According to another embodiment, a semiconductor device comprises a substrate, a first insulating layer disposed on the substrate, an oxide semiconductor disposed on the first insulating layer and formed in an island shape, a second insulating layer covering the oxide semiconductor, a gate electrode disposed on the second insulating layer, and a source electrode and a drain electrode in contact with the oxide semiconductor. The oxide semiconductor includes a plurality of openings located in at least one of an interval between the gate electrode and the source electrode and an interval between the gate electrode and the drain electrode, and a channel area overlapping the gate electrode, in planar view. A distance to a position farthest from each of the plurality of openings is less than 10 μm in the channel area.

Embodiments will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, an X-axis, a Y-axis and a Z-axis orthogonal to each other are described in the drawings to facilitate understanding as needed. A direction along the X-axis is referred to as an X-direction or a first direction, a direction along the Y-axis is referred to as a Y-direction or a second direction, and a direction along the Z-axis is referred to as a Z-direction or a third direction. A plane defined by the X-axis and the Y-axis is referred to as an X-Y plane and viewing the X-Y plane is referred to as planar view.

The semiconductor device 1 of the embodiments is applicable to various display devices such as liquid crystal display devices, organic electroluminescent display devices, electrophoretic display devices, and LED display devices, various sensors such as capacitive sensors and optical sensors, and other electronic devices.

Figure 1:
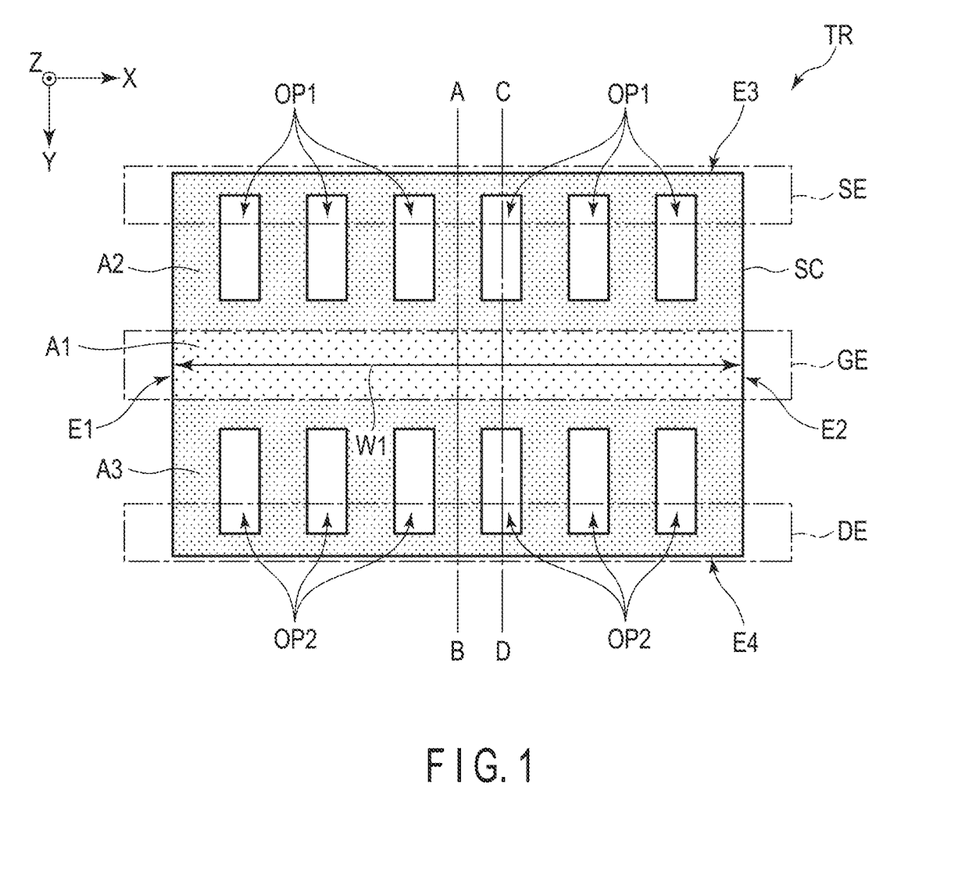
FIG. 1 is a plan view showing a configuration example of a transistor TR provided in the semiconductor device 1.

FIG. 1 is a plan view showing a configuration example of a transistor TR provided in the semiconductor device 1.

The transistor TR comprises the semiconductor SC, the gate electrode GE, the source electrode SE, and the drain electrode DE. The semiconductor SC is an oxide semiconductor. The gate electrode GE is an electrode electrically connected to a gate line. The source electrode SE is an electrode electrically connected to a source line, a power supply line or the like. The drain electrode DE is an electrode electrically connected to element electrodes that constitute pixel electrodes, bottom electrodes, anodes, cathodes or the like of various electronic devices.

In FIG. 1, the semiconductor SC is represented by a solid line, and each of the gate electrode GE, the source electrode SE, and the drain electrode DE is represented by a dotted line. Each of the gate electrode GE, the source electrode SE, and the drain electrode DE extends in the first direction X. The source electrode SE and the drain electrode DE are opposed in the second direction Y. The gate electrode GE is located between the source electrode SE and the drain electrode DE.

The semiconductor SC is formed in an island shape and has, for example, a rectangular planar shape. However, the shape of the semiconductor SC is not limited to the example shown in the figure. The semiconductor SC has an edge (first edge) E1 and an edge (second edge) E2 extending in the second direction Y, and an edge E3 and an edge E4 extending in the first direction X. The edge E2 is located on a side opposite to the edge E1 in the first direction X. The edge E4 is located on a side opposite to the edge E3 in the second direction Y.

The gate electrode GE intersects the edges E1 and E2. The source electrode SE overlaps an area including the edge E3, of the semiconductor SC. The drain electrode DE overlaps an area including the edge E4, of the semiconductor SC.

The semiconductor SC has areas A1 to A3. The areas A2, A1, and A3 are arranged in this order in the second direction Y. Each of the areas will be described below more specifically.

The area A1 extends in the first direction X between the edge E1 and the edge E2 and overlaps the gate electrode GE. The area A2 includes the edge E3 and is located between the area A1 (or the gate electrode GE) and the source electrode SE. The area A3 includes the edge E4 and is located between the area A1 (or the gate electrode GE) and the drain electrode DE.

In the semiconductor SC, the area A1 has a higher resistance than the areas A2 and A3. The resistance values of the areas A2 and A3 are equivalent to each other. The area A1 may be referred to as a high-resistance area or a channel area. A width (channel width) W1 along the first direction X from the edge E1 to the edge E2 of the area A1 is 10 µm or more. The area A2 may be referred to as a first low-resistance area or a source area. The area A3 may be referred to as a second low-resistance area or a drain area.

In addition, at the other viewpoint, the impurity concentration in each of the areas A2 and A3 is higher than that in the area A1. The impurity concentration in the areas A2 and A3 is equivalent to each other. Each of the areas A2 and A3 is doped with, for example, boron (B) or phosphorus (P) as the impurity. The area A1 is almost undoped with the impurity. The impurity concentration described herein can be expressed as the number of impurities per unit volume. For oxide semiconductors, a high impurity concentration means a high number of oxygen defects per unit volume or a high number of defects per unit volume.

The semiconductor SC may have a low-resistance area having a lower resistance than the area A1 and a higher resistance than the area A2, between the areas A1 and A2, and may have a low-resistance area having a lower resistance than the area A1 and a higher resistance than the area A3, between the areas A1 and A3.

The source electrode SE overlaps the area A2 that is the low-resistance area (source area), of the semiconductor SC in planar view. The source electrode SE is in contact with the area A2 in a contact hole to be described below.

The drain electrode DE overlaps the area A3 that is the low-resistance area (drain area), of the semiconductor SC in planar view. The drain electrode DE is in contact with the area A3 in a contact hole to be described below.

The semiconductor SC includes a plurality of first openings OP1 formed in the area A2 and a plurality of second openings OP2 formed in the area A3. For example, the first openings OP1 and the second openings OP2 are each formed in a square shape, but, their shapes are not limited to the example shown in the figure.

Each of the first openings OP1 is located between the gate electrode GE and the source electrode SE and does not overlap the gate electrode GE, in planar view. The plurality of first openings OP1 are spaced apart and arranged in the first direction X and extend in the second direction Y.

In the example illustrated, each of the first openings OP1 overlaps the source electrode SE, but may be formed not to overlap the source electrode SE. The first opening OP1 may be formed to open the edge E3 and, in this case, the area A2 is formed in a comb-like shape.

Each of the second openings OP2 is located between the gate electrode GE and the drain electrode DE and does not overlap the gate electrode GE, in planar view. The plurality of second openings OP2 are spaced apart and arranged in the first direction X and extend in the second direction Y. In addition, the first openings OP1 and the second openings OP2 are arranged in the second direction Y with the gate electrode GE (or the area A1) sandwiched therebetween.

In the example illustrated, each of the second openings OP2 overlaps the drain electrode DE, but may be formed not to overlap the drain electrode DE. The second opening OP2 may be formed to open the edge E4 and, in this case, the area A3 is formed in a comb-like shape.

In addition, the plurality of first openings OP1 and the plurality of second openings OP2 are disposed symmetrically with the gate electrode GE (or the area A1) sandwiched therebetween. In other words, the shape of the first openings OP1 is the same as the shape of the second openings OP2, the number of the first openings OP1 is the same as the number of the second openings OP2, the area of the first openings OP1 is the same as the area of the second openings OP2, and the pitch of the first openings OP1 is the same as the pitch of the second openings OP2.

Figure 2:
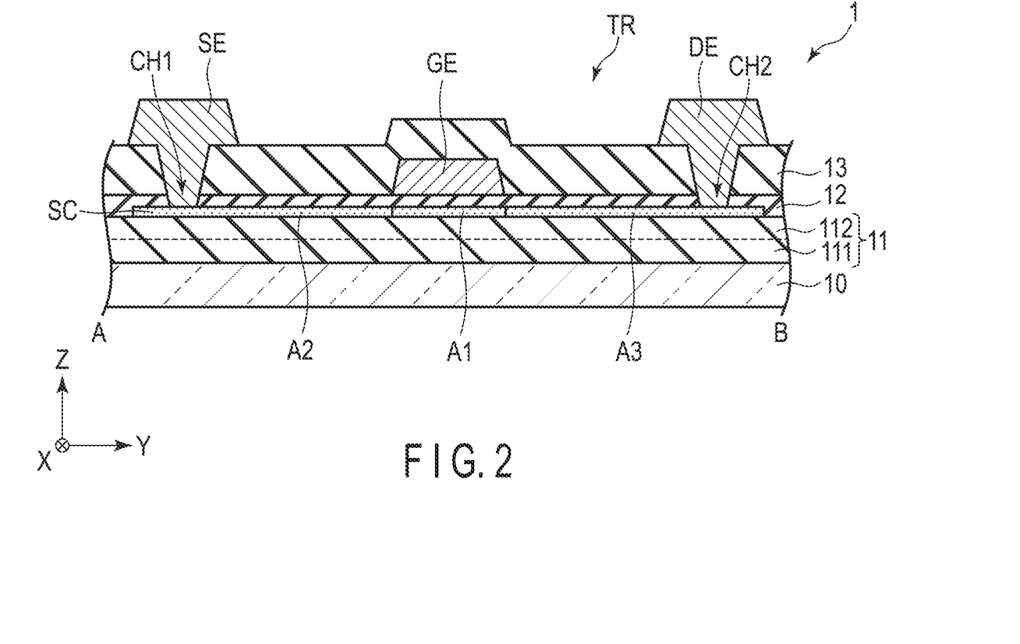
FIG. 2 is a cross-sectional view showing an example of the semiconductor device 1 comprising the transistor TR shown in FIG. 1.
Figure 3:
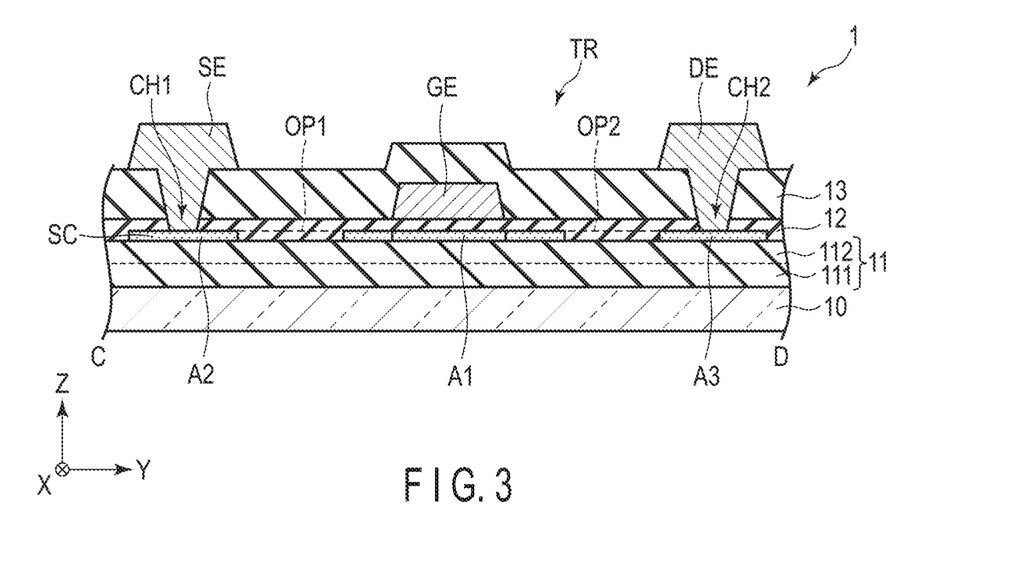
FIG. 3 is a cross-sectional view showing an example of the semiconductor device 1 comprising the transistor TR shown in FIG. 1.

FIG. 2 and FIG. 3 show cross-sectional views showing an example of the semiconductor device 1 comprising the transistor TR shown in FIG. 1. A cross-sectional view of the semiconductor device 1 taken along line A-B of FIG. 1 is shown in FIG. 2. A cross-sectional view of the semiconductor device 1 taken along line C-D of FIG. 1 is shown in FIG. 3.

The semiconductor device 1 comprises a substrate 10, a first insulating layer 11, a second insulating layer 12, a third insulating layer 13, and a transistor TR. One transistor TR included in the semiconductor device 1 is shown here. The transistor TR comprises the semiconductor SC, the gate electrode GE, the source electrode SE, and the drain electrode DE.

The first insulating layer 11 is disposed on the substrate 10. The semiconductor SC is disposed on the first insulating layer 11. The second insulating layer 12 is disposed on the first insulating layer 11 to cover the semiconductor SC. The second insulating layer 12 is in contact with the first insulating layer 11 in the first opening OP1 and the second opening OP2 of the semiconductor SC.

The gate electrode GE is located directly above the area A1 of the semiconductor SC and is disposed on the second insulating layer 12. The third insulating layer 13 is disposed on the second insulating layer 12 to cover the gate electrode GE.

The source electrode SE is located directly above the area A2 of the semiconductor SC and is disposed on the third insulating layer 13. In addition, the source electrode SE is in contact with the area A2 in the contact hole CH1 that penetrates the second insulating layer 12 and the third insulating layer 13.

The drain electrode DE is located directly above the area A3 of the semiconductor SC and is disposed on the third insulating layer 13. In addition, the drain electrode DE is in contact with the area A3 in the contact hole CH2 that penetrates the second insulating layer 12 and the third insulating layer 13.

The substrate 10 is formed of an insulating material such as glass or a resin film. The substrate 10 may be referred to as an insulating substrate.

Each of the first insulating layer 11, the second insulating layer 12, and the third insulating layer 13 may be a single-layer body or a multilayer body. These insulating layers are formed of transparent inorganic insulating materials such as silicon oxide, silicon nitride, and silicon oxynitride. For example, the first insulating layer 11 is a multilayer body formed of a first layer 111 that is a silicon nitride layer and a second layer 112 that is a silicon oxide layer. The second insulating layer 12 is a silicon oxide layer. In other words, each of the second layer 112 and the second insulating layer 12 which are in contact with the semiconductor SC is a silicon oxide layer.

The gate electrode GE, the source electrode SE, and the drain electrode DE are formed of, for example, metal materials such as aluminum (Al), titanium (Ti), molybdenum (Mo), tungsten (W), silver (Ag), copper (Cu), and chromium (Cr), alloys formed by combining these metal materials, or the like.

According to such a configuration example, in the semiconductor device 1 in which a silicon nitride layer that can serve as a hydrogen diffusion source is disposed between the substrate 10 and the semiconductor SC, hydrogen released from the silicon nitride layer is diffused through the first opening OP1 in the area A2 and the second opening OP2 in the area A3. Thus, the area of the semiconductor SC overlapping the hydrogen diffusion source is reduced by providing the first opening OP1 and the second opening OP2 in the semiconductor SC. Since the area of the semiconductor SC exposed to diffused hydrogen is thereby reduced, the diffusion of hydrogen to the area A1 which is the high resistance area is suppressed. Therefore, in a large transistor TR where the channel width W1 exceeds 10 μm, an undesired shift of a threshold voltage is suppressed and reduction in reliability is suppressed.

In addition, a transistor having substantially the same channel width can be installed in a smaller space as compared to a transistor including an opening in the area A1.

Next, the inventors conducted a reliability test on the transistor TR.

In this reliability test, the inventors compared Vg-Id characteristics in a case where a drain voltage was 0.1V with those in a case where the drain voltage is 10.1V. Vg indicates a gate voltage (V) applied to the gate electrode GE, and Id indicates a current (A) output from the drain electrode DE.

Figure 4:
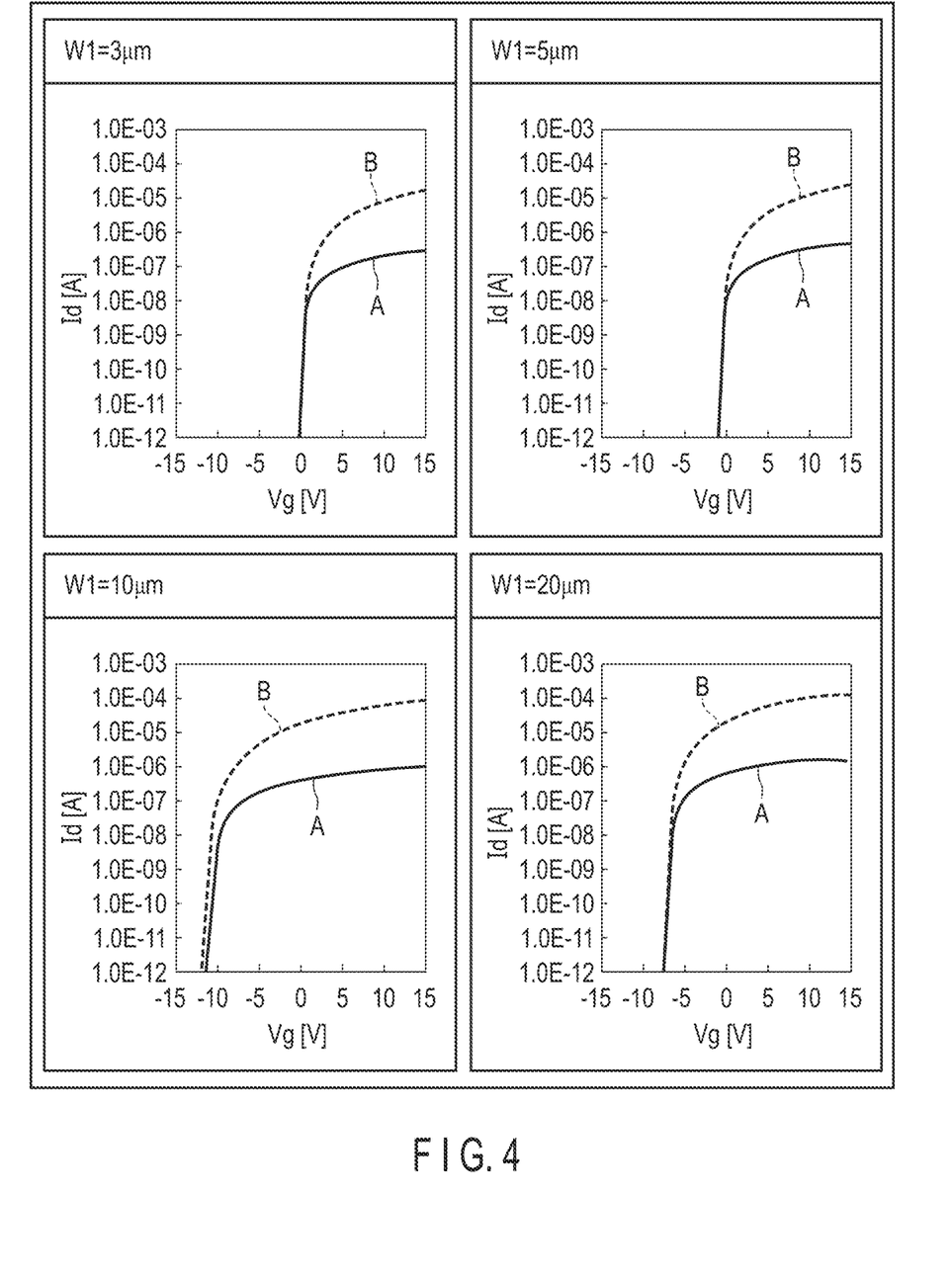
FIG. 4 is a graph showing results of reliability tests of the transistor TR.

FIG. 4 is a graph showing results of reliability tests of the transistor TR.

A horizontal axis indicates the gate voltage Vg, and a vertical axis indicates the drain current Id. A test result in a case where the drain voltage was 0.1V is indicated by A in the graph, and a test result in a case where the drain voltage was 10.1V is indicated by B in the graph.

The inventors conducted the reliability test of the transistor TR in each of the cases where the channel width W1 was 3 μm, 5 μm, 10 μm, and 20 μm. In each transistor TR, the semiconductor SC includes neither the first openings nor the second openings.

It was confirmed that the threshold voltage is around 0V when the channel width W1 is 3 μm and 5 μm. In contrast, it was confirmed that the threshold voltage is shifted to the negative side from 0V when the channel width W1 is 10 μm and 20 μm.

It was confirmed from these results that a semiconductor SC with a larger area is more likely to take in hydrogen released from the hydrogen diffusion source, leading to an increase in the carrier density in the area A1 in which a high resistance state should be maintained and causing a shift in the threshold voltage.

In particular, it was confirmed that when the channel width W1 is 10 μm or more, hydrogen reaching the area A2 and the area A3 diffuses into the area A1 and affects the threshold voltage of the transistor. In other words, when the semiconductor SC does not have an opening, the channel width W1 is desirably less than 10 μm and more desirably 5 μm or less in order to mitigate the influence of diffusion of hydrogen into the area A1.

In contrast, when the semiconductor SC includes the first openings OP1 and the second openings OP2, these openings form diffusion paths for hydrogen as described above. Therefore, even if the channel width W1 is 10 μm or more, the diffusion of hydrogen into the area A1 is suppressed by setting the distance to the position farthest from each of the openings in the area A1 to less than 10 μm or 5 μm or less. Therefore, according to the transistor TR comprising the semiconductor SC, the shift of the threshold voltage can be suppressed and high reliability can be obtained.

Figure 5:
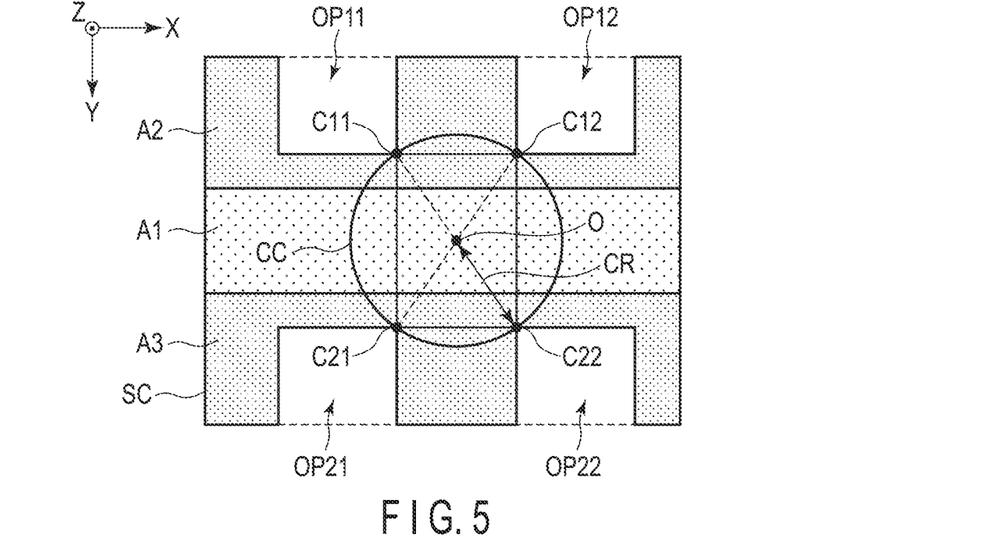
FIG. 5 is a view illustrating the position farthest from each of the openings in the area A1.

FIG. 5 is a view illustrating the position farthest from each of the openings in the area A1.

The semiconductor SC includes first openings OP11 and OP12 arranged in the first direction X as the first openings OP1, and second openings OP21 and OP22 arranged in the first direction X as the second openings OP2. As described with reference to FIG. 1, the first openings OP1 and the second openings OP2 are formed symmetrically with respect to the area A1. In other words, the first opening OP11 and the second opening OP21 are arranged in the second direction Y, and the first opening OP12 and the second opening OP22 are arranged in the second direction Y.

A corner C11 of the first opening OP11 is the point closest to the area A1 on the edge defining the first opening OP11, and closest to the first opening OP12.

A corner C12 of the first opening OP12 is the point closest to the area A1 on the edge defining the first opening OP12, and closest to the first opening OP11.

A corner C21 of the second opening OP21 is the point closest to the area A1 on the edge defining the second opening OP21, and closest to the second opening OP22.

A corner C22 of the second opening OP22 is the point closest to the area A1 on the edge defining the second opening OP22, and closest to the second opening OP21.

A circumcircle CC of a quadrangle formed by connecting these four corners C11, C12, C21, and C22 has a radius CR. Then, a center O of this circumcircle CC corresponds to the position farthest from each of four neighboring openings (OP11, OP12, OP21, and OP22) in the area A1. The radius CR corresponds to the distance from each of the four openings (OP11, OP12, OP21, and OP22) to the center O. The radius CR is desirably less than 10 μm and more desirably 5 μm or less as described above.

When the quadrangle formed by connecting the four corners C11, C12, C21, and C22 is a rectangle, the position farthest from each of four neighboring openings (OP11, OP12, OP21, and OP22) in the area A1 corresponds to an intersection of diagonal lines indicated by dotted lines.

Next, the inventors executed the following simulation.

Figure 6:
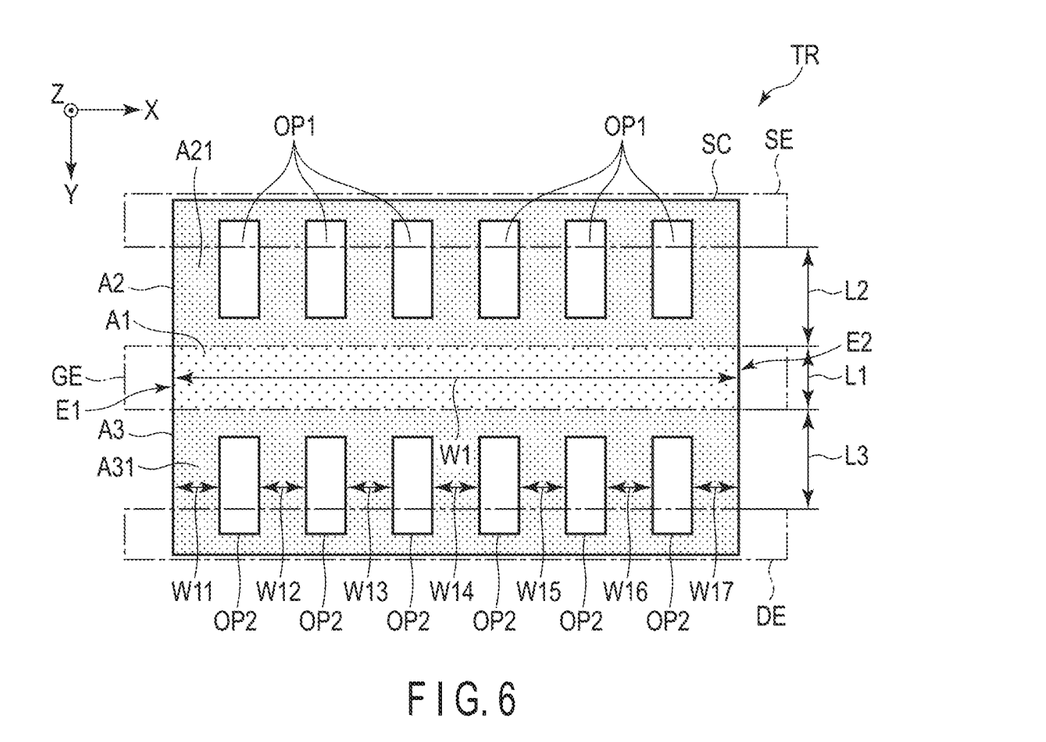
FIG. 6 is a view illustrating conditions for the simulation.

FIG. 6 is a view illustrating conditions for the simulation.

When a channel length along the second direction Y in the area A1 is L1, a wiring length along the second direction Y from the gate electrode GE to the source electrode SE in the area A2 is L2, and a wiring length along the second direction Y from the gate electrode GE to the drain electrode DE in the area A3 is L3, a wiring length ratio is defined by ((L2+L3)/L1). For example, when the channel length L1 is 4 μm, the wiring length L2 is 3 μm, and the wiring length L3 is 3 μm, the wiring length ratio is 1.5.

It is assumed that the plurality of first openings OP1 are formed symmetrically with the plurality of second openings OP2 and that a width W10 of a wiring portion A21 from the gate electrode GE to the source electrode SE is the same as a width W10 of a wiring portion A31 from the gate electrode GE to the drain electrode DE. In the example illustrated, six second openings OP2 are formed in the area A3. A width between one edge E1 of the semiconductor SC and the second opening OP2 close to the edge E1 is referred to as W11, widths between adjacent second openings OP2 are referred to as W12 to W16, and a width between the other edge E2 of the semiconductor SC and the second opening OP2 close to the edge E2 is referred to as W17. Each of the widths W11 to W17 described here is a length of the wiring portion A31 along the first direction X. When the total width of wiring portion A31 is referred to as W10, the total width W10 corresponds to a sum of the widths W11 to W17. A ratio (W10/W1) of the channel width W1 to the total width W10 is defined as a wiring width ratio.

When a resistance value in the area A1 is referred to as R1, a resistance value in the area A2 is referred to as R2, and a resistance value in the area A3 is referred to R3, a resistance ratio is defined by ((R2+R3)/R1). The resistance value R1 was calculated from a value of the drain current obtained under conditions that the channel width W1 is 3 μm, the channel length L1 is 3 μm, the gate voltage Vg is 20V, and the drain voltage is 10V.

Figure 7:
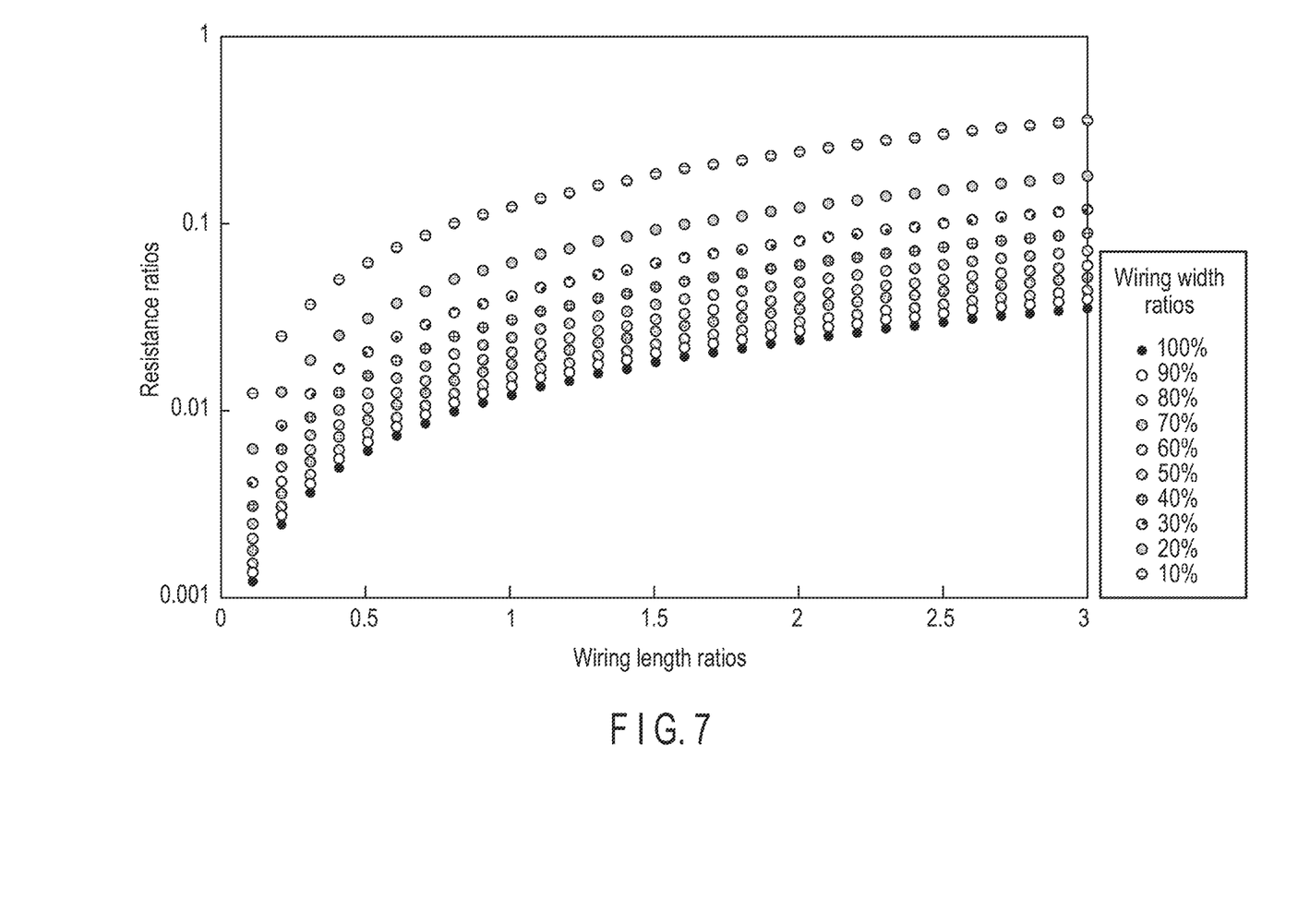
FIG. 7 is a graph showing results of simulation of the resistance ratios relative to the wiring length ratios.

FIG. 7 is a graph showing results of simulation of the resistance ratios relative to the wiring length ratios.

The horizontal axis indicates the wiring length ratios and the vertical axis indicates the resistance ratios. The simulation was executed in each of the cases where the wiring width ratios are 10%, 20%, 30%, 40%, 50%, 60%, 70%, 80%, 90%, and 100%.

The resistance value R2 of the area A2 that is the low-resistance area, and the resistance value R3 of the area A3 that is the low-resistance area are higher as the wiring width ratio becomes smaller. As the area of the first opening OP1 and the area of the second opening OP2 are larger, the resistance value (R2+R3) is likely to increase.

For example, when the resistance ratio of 0.1 or less is required in the transistor TR having the wiring length ratio of 1.5, the wiring width ratio is desirably 20% or more. In other words, the total area of the first opening OP1 and the total area of the second opening OP2 can be increased until the wiring width ratio becomes approximately 20%. Thus, the hydrogen diffusion path can be expanded and a more reliable transistor TR can be obtained by expanding the area of the openings within a range where the desired resistance ratio can be obtained.

Figure 8:
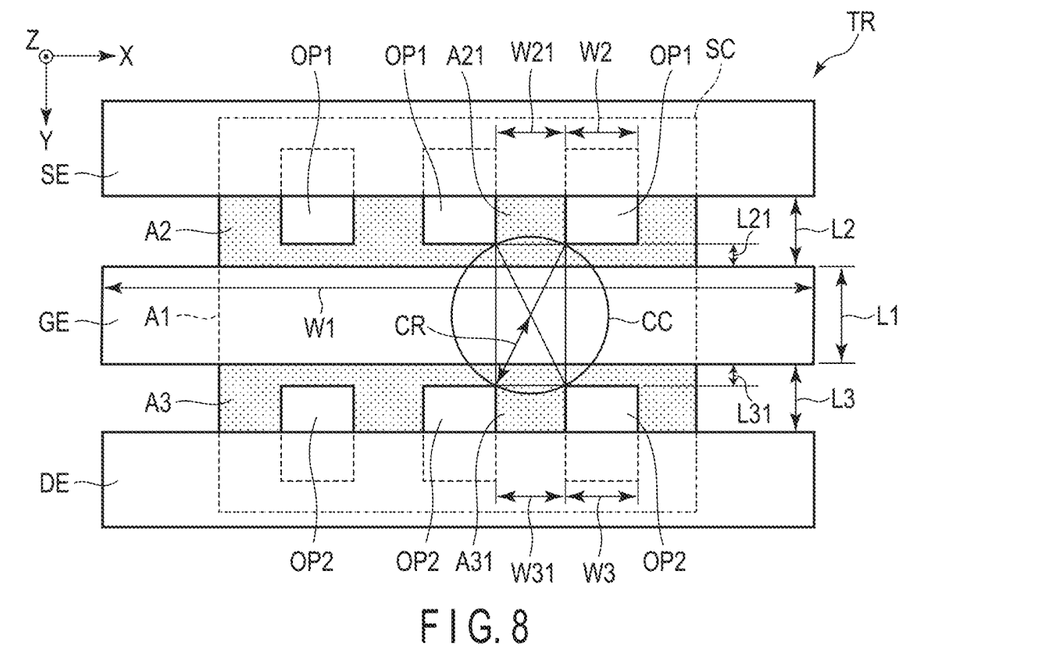
FIG. 8 is a plan view illustrating the embodiment.

FIG. 8 is a plan view illustrating the embodiment.

The channel length L1 is 4 μm.

In the area A2, the wiring length L2 is 3 μm, and a length L21 of the area A2 along the second direction Y from the area A1 to the first opening OP1 is 1 μm.

In the area A3, the wiring length L3 is 3 μm, and a length L31 of the area A3 along the second direction Y from the area A1 to the second opening OP2 is 1 μm.

The channel width W1 is 20 μm.

In the area A2, the width W2 along the first direction X of each of three first openings OP1 is 3 μm, and the width W21 along the first direction X of the wiring portion A21 is 3 μm.

In the area A3, the width W3 along the first direction X of each of three second openings OP2 is 3 μm, and the width W31 along the first direction X of the wiring portion A31 is 3 μm.

At this time, the radius CR of the circumcircle CC is 3.35 μm. In other words, the radius CR corresponding to the distance to the position farthest from each of the openings in the area A1 is 5 μm or less, and the shift of the threshold voltage can be suppressed as described with reference to FIG. 4.

In addition, the wiring length ratio described with reference to FIG. 6 is 1.5, and the wiring width ratio is 55%. At this time, according to the simulation results in FIG. 7, the resistance ratio is 0.041, and the desired transistor characteristics can be obtained.

Next, other configuration examples will be described. Several configuration examples described below are different from the configuration example shown in FIG. 1 in that the plurality of first openings OP1 and the plurality of second openings OP2 are disposed asymmetrically with the gate electrode GE sandwiched therebetween.

Figure 9:
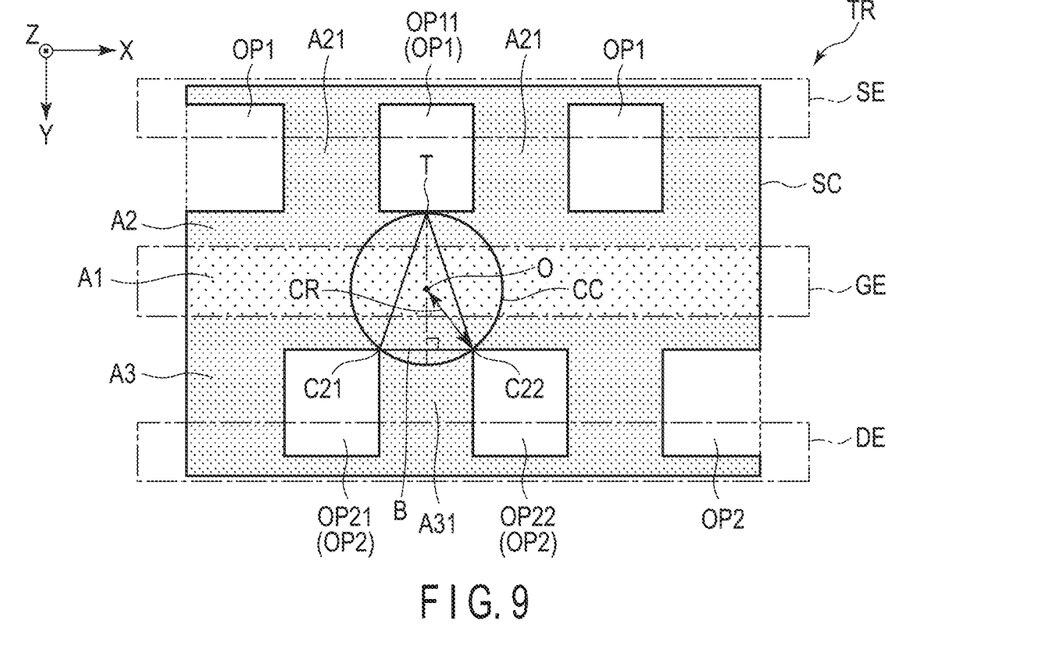
FIG. 9 is a plan view showing another configuration example of the transistor TR provided in the semiconductor device 1.

FIG. 9 is a plan view showing another configuration example of the transistor TR provided in the semiconductor device 1.

The semiconductor SC includes a plurality of first openings OP1 including the first opening OP11, and a plurality of second openings OP2 including the second openings OP21 and OP22.

The plurality of first openings OP1 are formed in the area A2 and are spaced apart and arranged in the first direction X. In addition, the plurality of first openings OP1 are located between the gate electrode GE and the source electrode SE and do not overlap the gate electrode GE in planar view.

The plurality of second openings OP2 are formed in the area A3 and are spaced apart and arranged in the first direction X. In addition, the plurality of second openings OP2 are located between the gate electrode GE and the drain electrode DE and do not overlap the gate electrode GE in planar view.

The first openings OP1 and the second openings OP2 are disposed asymmetrically with the gate electrode GE (or the area A1) sandwiched therebetween.

The shape of the first openings OP1 is the same as the shape of the second openings OP2, the number of the first openings OP1 is the same as the number of the second openings OP2, the area of the first openings OP1 is the same as the area of the second openings OP2, and the pitch of the first openings OP1 is the same as the pitch of the second openings OP2.

The first openings OP1 and the second openings OP2 are arranged in a staggered pattern. In other words, the first openings OP1 and the second openings OP2 are not arranged in the second direction Y. The first openings OP1 and the wiring portion A31 are arranged in the second direction Y. In addition, the wiring portion A21 and the second openings OP2 are arranged in the second direction Y.

For example, in the first direction X, the first opening OP11 is located between two adjacent second openings OP21 and OP22.

In this configuration example, the position farthest from each of the openings in the area A1 can be defined as follows. First, a line connecting the corner C21 of the second opening OP21 and the corner C22 of the second opening OP22 is referred to as a bottom side B. Then, an intersection of the perpendicular bisector of a bottom side B and the first opening OP11 is referred to as a vertex T.

A circumcircle CC of an isosceles triangle connecting corners C21 and C22 and the vertex T has a radius CR. A center O of this circumcircle CC corresponds to the position farthest from each of the three neighboring openings (OP11, OP21, and OP22) in the area A1. The radius CR corresponds to the distance from each of the three openings (OP11, OP21, and OP22) to the center O. The radius CR is desirably less than 10 μm and more desirably 5 μm or less as described above.

Figure 10:
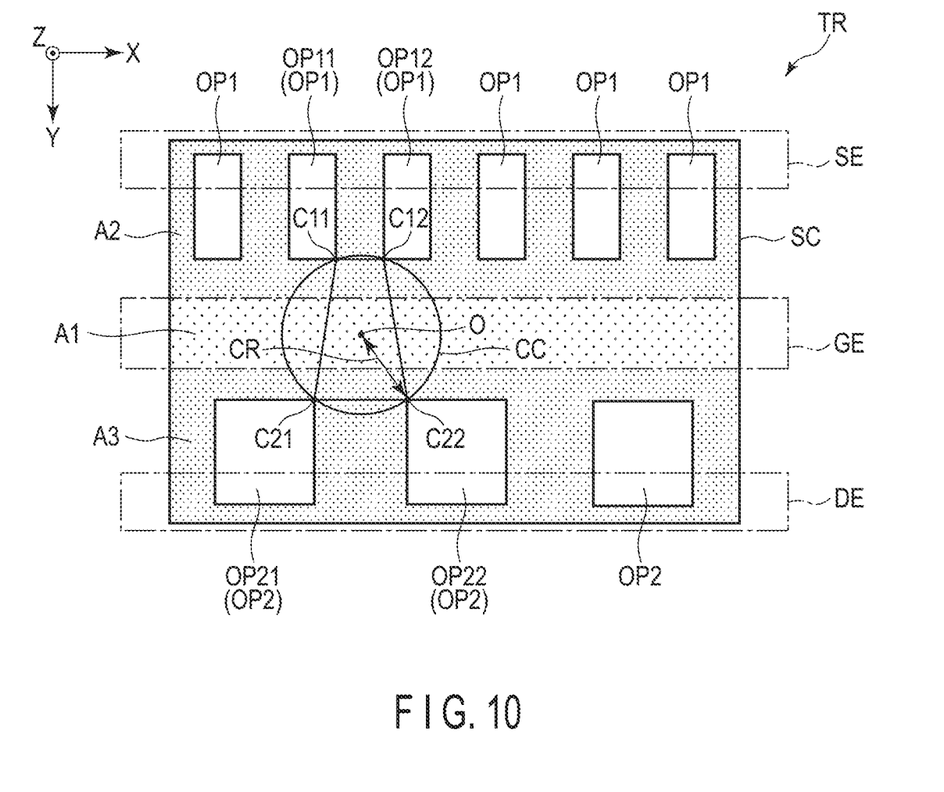
FIG. 10 is a plan view showing yet another configuration example of the transistor TR provided in the semiconductor device 1.

FIG. 10 is a plan view showing yet another configuration example of the transistor TR provided in the semiconductor device 1.

The semiconductor SC includes a plurality of first openings OP1 including the first openings OP11 and OP12, and a plurality of second openings OP2 including the second openings OP21 and OP22.

In the configuration example shown in FIG. 10, the shape of the first openings OP1 is different from the shape of the second openings OP2. Each of the first openings OP1 and the second openings OP2 is a quadrangle, and the second opening OP2 is more extended than the first opening OP1 along the first direction X.

The area of the first opening OP1 is different from the area of the second opening OP2. The area of the first opening OP1 is smaller than the area of the second opening OP2.

In addition, the number of the first openings OP1 is different from the number of the second openings OP2. The number of the first openings OP1 is greater than the number of the second openings OP2.

Furthermore, the pitch of the first openings OP1 is different from the pitch of the second openings OP2. The pitch of the first openings OP1 is smaller than the pitch of the second openings OP2.

In this configuration example, the position farthest from each of the openings in the area A1 can be defined as follows. A circumcircle CC of a quadrangle formed by connecting a corner C11 of the first opening OP11, a corner C12 of the first opening OP12, a corner C21 of the second opening OP21, and a corner C22 of the second opening OP22 has a radius CR. Then, a center O of this circumcircle CC corresponds to the position farthest from each of four neighboring openings (OP11, OP12, OP21, and OP22) in the area A1. The radius CR corresponds to the distance from each of the four openings (OP11, OP12, OP21, and OP22) to the center O. The radius CR is desirably less than 10 μm and more desirably 5 μm or less as described above.

Figure 11:
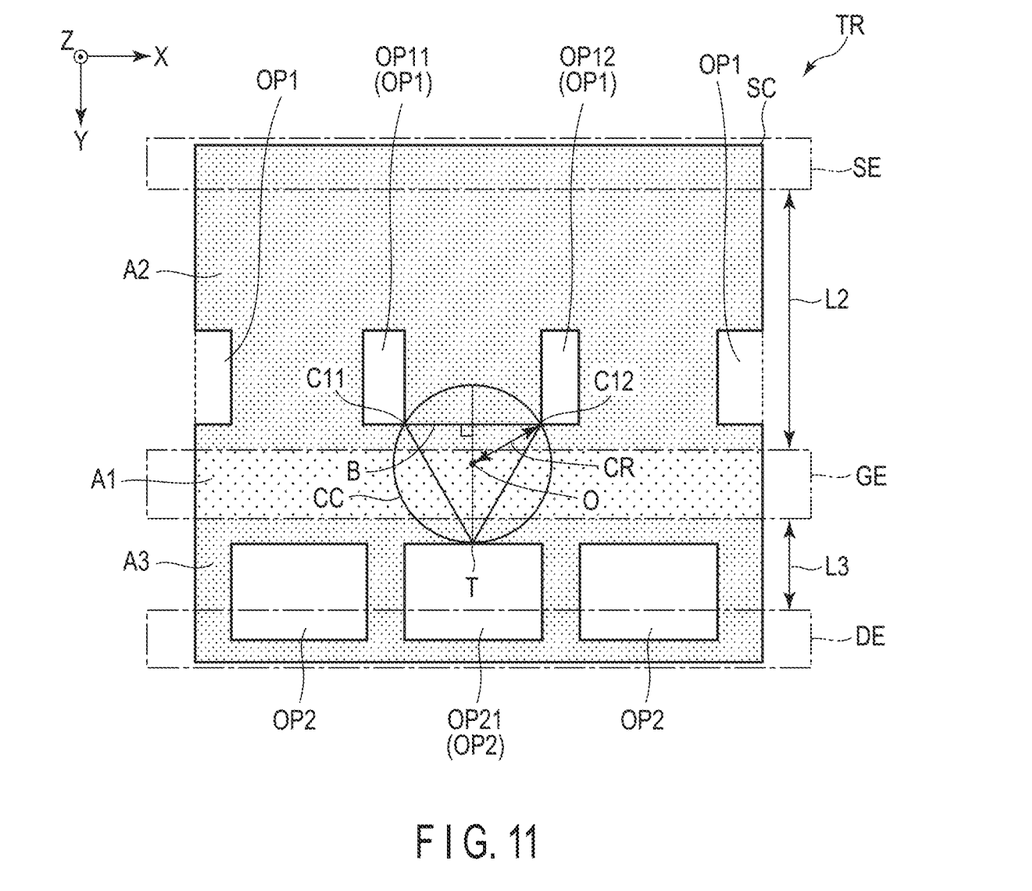
FIG. 11 is a plan view showing yet another configuration example of the transistor TR provided in the semiconductor device 1.

FIG. 11 is a plan view showing yet another configuration example of the transistor TR provided in the semiconductor device 1.

The semiconductor SC includes a plurality of first openings OP1 including the first openings OP11 and OP12, and a plurality of second openings OP2 including the second opening OP21.

In the configuration example shown in FIG. 11, each of the first openings OP1 and the second openings OP2 is a quadrangle, but the area of the first opening OP1 is smaller than the area of the second opening OP2.

In addition, the number of the first openings OP1 is greater than the number of the second openings OP2.

Furthermore, the wiring length L2 between the gate electrode GE and the source electrode SE in the area A2 is different from the wiring length L3 between the gate electrode GE and the drain electrode DE in the area A3. The wiring length L2 is greater than the wiring length L3.

In this configuration example, the position farthest from each of the openings in the area A1 can be defined as follows. First, a line connecting a corner C11 of the first opening OP11 and a corner C12 of the first opening OP12 is referred to as a bottom side B. Then, an intersection of a perpendicular bisector of the bottom side B and the second opening OP21 is referred to as a vertex T.

The circumcircle CC of an isosceles triangle connecting the corners C11 and C12 and the vertex T has a radius CR. A center O of this circumcircle CC corresponds to the position farthest from each of three neighboring openings (OP11, OP12, and OP21) in the area A1. The radius CR corresponds to the distance from each of the three openings (OP11, OP12, and OP21) to the center O. The radius CR is desirably less than 10 μm and more desirably 5 μm or less as described above.

Figure 12:
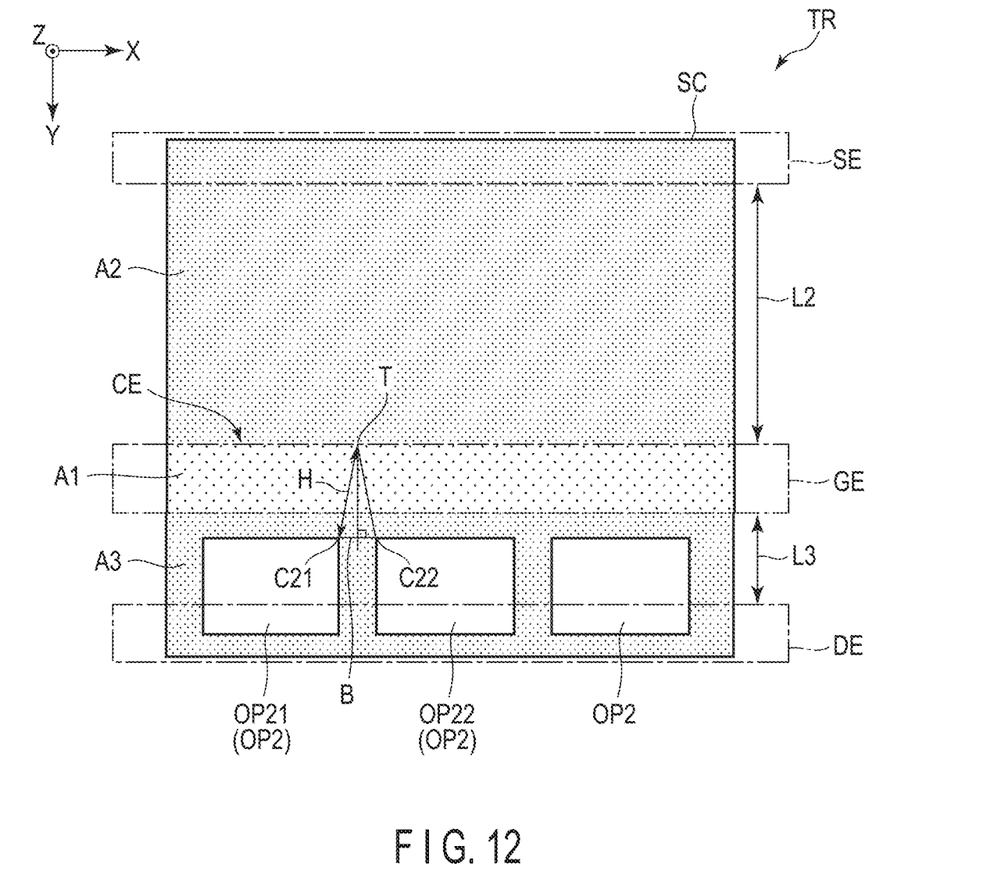
FIG. 12 is a plan view showing yet another configuration example of the transistor TR provided in the semiconductor device 1.

FIG. 12 is a plan view showing yet another configuration example of the transistor TR provided in the semiconductor device 1.

The semiconductor SC includes a plurality of second openings OP2 including the second openings OP21 and OP22, but does not include the first openings.

In the configuration example shown in FIG. 12, the wiring length L2 is greater than the wiring length L3.

In this configuration example, the position farthest from each of the openings in the area A1 can be defined as follows. First, a line connecting the corner C21 of the second opening OP21 and the corner C22 of the second opening OP22 is referred to as a bottom side B. A boundary between the area A1 and the area A2 (or a side edge of the gate electrode GE) is referred to as a channel edge CE. Then, an intersection of the perpendicular bisector of the bottom side B and the channel edge CE is referred to as a vertex T.

The vertex T corresponds to the position farthest from each of the two neighboring openings (OP21 and OP22) in the area A1. An oblique side H of an isosceles triangle connecting the corners C21 and C22 and the vertex T is desirably less than 10 μm and more desirably 5 μm or less as described above.

In the above embodiment, the transistor TR may be a top-gate type, bottom-gate type or dual-gate type transistor. In addition, a method for forming the high resistance area A1 and the low resistance areas A2 and A3 in the oxide semiconductor is not particularly limited.

As described above, according to the embodiment, a semiconductor device capable of suppressing the reduction in reliability can be provided.

All of the semiconductor devices that can be implemented by a person of ordinary skill in the art through arbitrary design changes to the semiconductor devices described above as embodiments of the present invention come within the scope of the present invention as long as they are in keeping with the spirit of the present invention.

Various types of the modified examples are easily conceivable within the category of the ideas of the present invention by a person of ordinary skill in the art and the modified examples are also considered to fall within the scope of the present invention. For example, additions, deletions or changes in design of the constituent elements or additions, omissions, or changes in condition of the processes arbitrarily conducted by a person of ordinary skill in the art, in the above embodiments, fall within the scope of the present invention as long as they are in keeping with the spirit of the present invention.

In addition, the other advantages of the aspects described in the embodiments, which are obvious from the descriptions of the present specification or which can be arbitrarily conceived by a person of ordinary skill in the art, are considered to be achievable by the present invention as a matter of course.

What is claimed is:

1. A semiconductor device comprising:
a substrate;
a first insulating layer disposed on the substrate;
an oxide semiconductor disposed on the first insulating layer and formed in an island shape;
a second insulating layer covering the oxide semiconductor;
a gate electrode disposed on the second insulating layer; and
a source electrode and a drain electrode in contact with the oxide semiconductor, wherein
the oxide semiconductor includes
a channel area overlapping the gate electrode,
a first area which is connected to the channel area, is in contact with the source electrode, and includes a plurality of first openings located between the gate electrode and the source electrode, and
a second area which is connected to the channel area, is in contact with the drain electrode, and includes a plurality of second openings located between the gate electrode and the drain electrode,
each of the first openings is surrounded by the oxide semiconductor,
each of the second openings is surrounded by the oxide semiconductor, and
the second insulating layer overlaps the channel area, the first area and the second area, and is in contact with the first insulating layer in the plurality of first openings and the plurality of second openings.

2. The semiconductor device of claim 1, wherein
the plurality of first openings and the plurality of second openings do not overlap the gate electrode in planar view.

3. The semiconductor device of claim 2, wherein
the plurality of first openings and the plurality of second openings are arranged in a first direction and are disposed symmetrically with the gate electrode sandwiched therebetween.

4. A semiconductor device comprising:
a substrate;
a first insulating layer disposed on the substrate;
an oxide semiconductor disposed on the first insulating layer and formed in an island shape;
a second insulating layer covering the oxide semiconductor;
a gate electrode disposed on the second insulating layer; and
a source electrode and a drain electrode in contact with the oxide semiconductor, wherein
the oxide semiconductor includes
a channel area overlapping the gate electrode,
a first area which is connected to the channel area and is in contact with the source electrode, and
a second area which is connected to the channel area and is in contact with the drain electrode,
at least one of the first area and the second area includes a plurality of openings,
each of the openings is surrounded by the oxide semiconductor,
the second insulating layer overlaps the channel area, the first area and the second area, and is in contact with the first insulating layer in the plurality of openings, and
a distance to a position farthest from each of the plurality of openings is less than 10 μm in the channel area.

5. The semiconductor device of claim 4, wherein
the distance is 5 μm or less.

6. The semiconductor device of claim 4, wherein
the oxide semiconductor includes a first edge intersecting the gate electrode, and a second edge intersecting the gate electrode on a side opposite to the first edge, and
a width from the first edge to the second edge in the channel area is 10 μm or more.

* * * * *